(12) United States Patent
Carlson

(10) Patent No.: US 7,561,278 B2
(45) Date of Patent: Jul. 14, 2009

(54) INTERFEROMETER USING INTEGRATED RETARDERS TO REDUCE PHYSICAL VOLUME

(75) Inventor: Andrew Eric Carlson, Higganum, CT (US)

(73) Assignee: Zygo Corporation, Middlefield, CT (US)

( * ) Notice: Subject to any disclaimer, the term of this patent is extended or adjusted under 35 U.S.C. 154(b) by 0 days.

(21) Appl. No.: 11/582,869

(22) Filed: Oct. 18, 2006

(65) Prior Publication Data

US 2007/0086016 A1  Apr. 19, 2007

Related U.S. Application Data

(60) Provisional application No. 60/728,348, filed on Oct. 18, 2005.

(51) Int. Cl.
*G01B 9/02* (2006.01)
*G01B 11/02* (2006.01)

(52) U.S. Cl. ........................... 356/493; 356/500
(58) Field of Classification Search ............. 356/491, 356/492, 493, 496, 498, 500
See application file for complete search history.

(56) References Cited

U.S. PATENT DOCUMENTS

| | | | |
|---|---|---|---|
| 4,881,816 A | | 11/1989 | Zanoni |
| 4,883,357 A | | 11/1989 | Zanoni et al. |
| 5,064,289 A | | 11/1991 | Bockman |
| 6,163,379 A | | 12/2000 | de Groot |
| 6,542,247 B2 | | 4/2003 | Bockman |
| 6,757,066 B2 | | 6/2004 | Hill |
| 6,819,431 B2 | | 11/2004 | Carlson |
| 6,819,434 B2 | | 11/2004 | Hill |
| 6,842,217 B1 * | | 1/2005 | Miller et al. ............ 349/198 |
| 6,943,930 B2 * | | 9/2005 | Mi et al. ................. 359/247 |
| 7,330,272 B2 * | | 2/2008 | Belt et al. .............. 356/487 |

\* cited by examiner

*Primary Examiner*—Michael A Lyons
(74) *Attorney, Agent, or Firm*—Fish & Richardson P.C.

(57) ABSTRACT

An apparatus includes an interferometer having a polarizing beam splitter to split an input beam into a measurement beam and a reference beam, the measurement beam contacting a measurement object, the reference beam contacting a reference object. The interferometer includes at least one thin retarder on a surface of the interferometer.

32 Claims, 8 Drawing Sheets

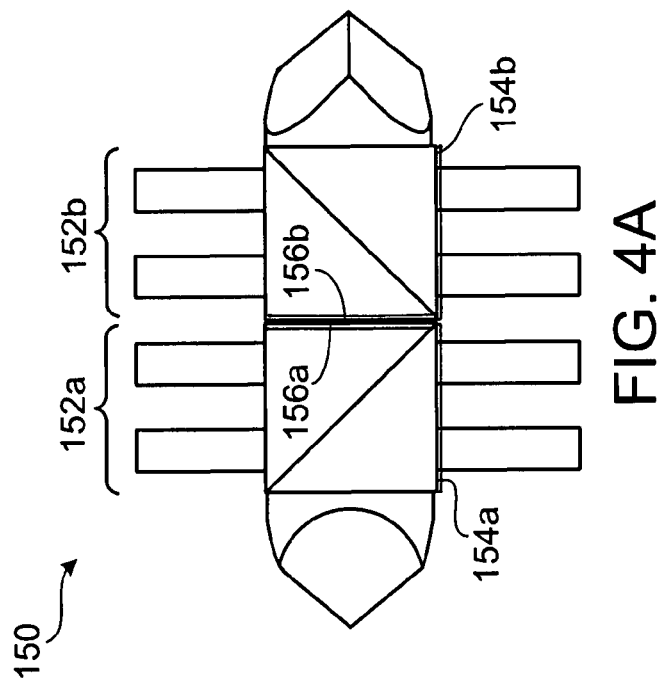
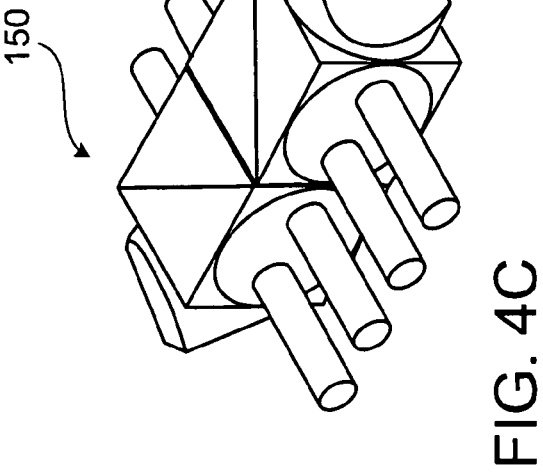
FIG. 4A
FIG. 4B
FIG. 4C

INTERFEROMETER USING INTEGRATED RETARDERS TO REDUCE PHYSICAL VOLUME

CROSS-REFERENCE TO RELATED APPLICATIONS

This application claims priority under 35 U.S.C. §119(e) to Provisional Patent Application 60/728,348, filed on Oct. 18, 2005, entitled "INTERFEROMETER USING INTEGRATED RETARDERS TO REDUCE PHYSICAL VOLUME," to Andrew Carlson, the content of which is hereby incorporated by reference.

BACKGROUND

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from the reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam splitter to direct the measurement and reference beams to the measurement and reference objects, respectively, and combine the reflected measurement and reference beams to form overlapping exit measurement and reference beams. The overlapping exit beams form an output beam that subsequently passes through a polarizer.

The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2vnp/\lambda$, where v is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the relative position of the measurement object correspond to changes in the phase of the measured interference signal, with a $2\pi$ phase change substantially equal to a distance change L of $\lambda/(np)$, where L is a round-trip distance change, e.g., the change in distance to and from a stage that includes the measurement object.

Unfortunately, this equality is not always exact. In addition, the amplitude of the measured interference signal may be variable. A variable amplitude may subsequently reduce the accuracy of measured phase changes. Many interferometers include non-linearities such as what are known as "cyclic errors." The cyclic errors can be expressed as contributions to the phase and/or the intensity of the measured interference signal and have a sinusoidal dependence on the change in optical path length pnL. In particular, the first harmonic cyclic error in phase has a sinusoidal dependence on $(2\pi pnL)/\lambda$ and the second harmonic cyclic error in phase has a sinusoidal dependence on $2(2\pi pnL)/\lambda$. Higher harmonic cyclic errors and sub-harmonic cyclic errors can also be present.

Cyclic errors may arise in interferometers from one or more of various sources. For example, in some interferometers, cyclic errors may arise from imperfections in a polarizing beam splitter cube used to separate the components of an incident optical beam into a measurement beam and a reference beam. Nominally, the optical beam may include two beam components having different frequencies, the components further being orthogonally polarized relative to one another. However, the polarization orientations of the beam components may not be perfectly aligned with the s and p polarization directions of the beam splitter cube, and may in some cases be rotated with respect to the s and p directions. Alternatively, or in addition, either or both of the polarization directions of the optical beam components may change on passing through the optical elements of the system, such as the beam splitter cube for example, due to birefringence in the optical elements. Furthermore, misalignment of optical components in an interferometer or interferometry system may occur over time. Any of these sources of error may lead to leakage of a portion of one beam component into a measurement or reference beam that nominally corresponds only to the other beam component. In some cases, portions of each beam component may be present in both the measurement and reference beams. Leakage of beam components into the measurement and/or reference beams may produce cyclic errors in measured interferometry data.

In dispersion measuring applications, optical path length measurements are made at multiple wavelengths, e.g., 532 nm and 1064 nm, and are used to measure the dispersion of a gas in the measurement path of a displacement measuring interferometer. The dispersion measurement can be used in converting an optical path length measured by a displacement measuring interferometer into a physical length. Such a conversion can be important since changes in the measured optical path length can be caused by gas turbulence and/or by a change in the average density of the gas in the measurement arm even though the physical distance to the measurement object is unchanged.

The interferometers described above are often crucial components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beam with a corresponding reference beam, and collectively the interferometers accurately measure changes in the position of the stage relative to the radiation beam. The interferometers enable the lithography system to precisely control which regions of the wafer are exposed to the radiation beam.

In many lithography systems and other applications, the measurement object includes one or more plane mirrors to reflect the measurement beam from the measurement object. Small changes in the angular orientation of the measurement object, e.g., pitch and yaw of a stage, can alter the direction of each measurement beam reflected from the plane mirrors. If left uncompensated, the altered measurement beams reduce the overlap of the exit measurement and reference beams in each corresponding interferometer. Furthermore, these exit measurement and reference beams will not be propagating parallel to one another nor will their wave fronts be aligned when forming the mixed beam. As a result, the interference between the exit measurement and reference beams will vary across the transverse profile of the mixed beam, thereby corrupting the interference information encoded in the optical intensity measured by the detector.

To address this problem, many conventional interferometers include a retroreflector that redirects the measurement beam back to the plane mirror so that the measurement beam "double passes" the path between the interferometer and the measurement object. The presence of the retroreflector ensures that the direction of the exit measurement is insensitive to changes in the angular orientation of the measurement object. When implemented in a plane mirror interferometer, the configuration results in what is commonly referred to as a high-stability plane mirror interferometer (HSPMI). However, even with the retroreflector, the lateral position of the exit measurement beam remains sensitive to changes in the angular orientation of the measurement object. Furthermore, the path of the measurement beam through optical elements within the interferometer also remains sensitive to changes in the angular orientation of the measurement object.

HSPMIs generally include a quarter-wave retarder in each of the measurement and reference legs to rotate linearly polarized light by ninety degrees following a two passes through the retarder (one to, and a second from, the measurement and reference mirrors, respectively.) In one configuration, the quarter-wave retarder is a zero-order retarder made of quartz and is relatively thick (e.g., a couple of millimeters.) In another configuration, the quarter-wave retarder is a stretched polymer sheet, which by itself is relatively thin (e.g., about 100-200 microns). However, the stretched polymer is generally not sufficiently optically flat to be secured to an interferometer surface without a glass cover plate. The glass cover plate causes the resulting retarder assembly to be relatively thick (e.g., a couple of millimeters or more.)

SUMMARY

A relatively thin retarder (compared to a conventional retarder having a thick glass cover plate) can be applied to an interferometer surface, without requiring the support of a thick glass cover plate, and be sufficiently flat for interferometric optical applications. For example, a thin (e.g., less than 1 mm, or less than about 500 microns, or less than 100 microns) quarter-wave retarder can be applied to a polarizing beam splitter cube of an HSPMI on each of measurement and reference faces, without any cover plate. Furthermore, for example, a reflective coating can be applied directly to the retarder on the reference face to form a reference mirror.

As a result of the use of the thin retarders, the physical volume of distance measuring interferometers, such as an HSPMI, can be reduced. This is useful in many lithographic applications because, for example, multiple interferometer units and their respective measurement axes can be brought closer to one another, thereby decreasing the footprint of the beams on a stage mirror of a wafer or reticle stage.

Different aspects and features of the invention are summarized below.

In general, in one aspect, an apparatus is disclosed that includes an interferometer including at least one thin retarder on a surface of the interferometer.

The apparatus may include one or more of the following features.

The thin retarder may be secured to the surface of the interferometer without a glass cover plate.

The thin retarder may be optically flat.

The retarder can be thinner than 1 millimeter, or even thinner than 500 microns, or even thinner than 100 microns.

The thin retarder can have a coating applied directly onto it. For example, the coating can be an anti-reflection (AR) coating or a high-reflection (HR) coating.

The interferometer can be a double-pass interferometer. For example, it can be a high-stability plane mirror interferometer (HSPMI).

The interferometer can include a polarizing beam splitter. In such cases, the thin retarder can be applied to a surface of the polarizing beam splitter. Furthermore, the thin retarder can be applied to a reference face of the polarizing beam splitter and the interferometer can include a second thin retarder applied to a measurement face of the polarizing beam splitter. In other embodiments, the interferometer can further include a retroreflector and the thin retarder can be applied to a surface of the retroreflector.

The thin retarder can be a quarter-wave retarder. Alternatively, the thin retarder can be a half-wave retarder.

The apparatus can further include additional interferometers positioned next to the first mentioned interferometer. For example, the two interferometers can be mechanically secured to one another. Furthermore, the additional interferometer can include at least one thin retarder secured to one of its surfaces.

The thin retarder can include a sub-wavelength grating or pattern formed in the surface.

The thin retarder can include linearly photopolymerizable polymer (LPP) material.

The thin retarder can includes an inorganic, birefringent material, such as quartz, having a thickness less than 200 microns, or even less than 50 microns.

The interferometer can include a retroreflector having a surface for receiving an input light beam that is retro-reflected to form an output light beam that passes the surface, and the at least one thin retarder includes a linearly photopolymerizable polymer (LPP) material coated onto at least a portion of the surface of the retroreflector to form a film that changes a polarization direction and/or an ellipticity of at least one of the input light beam and the output light beam, the film having a thickness less than 1 mm.

The apparatus can include a source to provide a write beam to pattern a substrate, a stage to support the substrate, a beam directing assembly to deliver the write beam to the substrate, and a positioning system to position the stage and beam directing assembly relative to one another, in which the interferometer and the optics are used to measure the position of the stage relative to the beam directing assembly.

In general, in another aspect, a lithography system is disclosed for use in fabricating integrated circuits on a wafer. The lithography system includes a stage to support the wafer, an illumination system to image spatially patterned radiation onto the wafer, a positioning system to adjust the position of the stage relative to the imaged radiation, and any one of the apparatuses described above to measure the position of the stage along a first degree of freedom.

The method may include one or more of the following features.

The lithography system can include a second one of the apparatuses described above to measure the position of the stage along a second degree of freedom.

In general, in another aspect, a lithography system is disclosed for use in fabricating integrated circuits on a wafer. The lithography system includes a stage to support the wafer, an illumination system including a radiation source, a mask, a positioning system, a lens assembly, and any of the apparatuses described above in which during operation the source directs radiation through the mask to produce spatially patterned radiation, the positioning system adjusts the position of the mask relative to wafer, the lens assembly images the spatially patterned radiation onto the wafer, and the apparatus measures the position of the mask along a first degree of freedom relative to the wafer.

The lithography system may include one or more of the following features.

The lithography system can include a second one of the apparatuses to measure the position of the mask along a second degree of freedom.

In general, in another aspect, a method is disclosed that includes coating a linearly photopolymerizable polymer (LPP) material onto an optical surface of an interferometer to form a film that changes a polarization direction and/or an ellipticity of a light beam in the interferometer, the film having a thickness less than 1 mm.

The method may include one or more of the following features.

The method can include processing the LPP material to have a specific thickness to generate at least one of a quarter wave plate and a half wave plate with respect to the light beam.

In general, in another aspect, a method is disclosed that includes applying at least one thin retarder on a surface of an interferometer.

The method may include one or more of the following features.

The method can include securing the thin retarder to the surface of the interferometer without a glass cover plate.

The retarder can be thinner than 1 millimeter, or even thinner than 500 microns.

In general, in another aspect, a method is disclosed that includes modifying a lithography tool by reducing a size of an interferometer to enable the lithography tool to process larger wafers than prior to modification, the size of the interferometer being reduced by using at least a thin retarder on a surface of the interferometer, the thin retarder having a thickness less than 1 millimeter.

The method may include one or more of the following features.

The thin retarder can include a quarter-wave retarder, or a half-wave retarder.

Interferometers using thin retarders may include one or more of the following advantages. The cost of the interferometers can be reduced because the number of optical components is reduced. The axis-to-axis separation can be reduced when nesting multiple interferometer assemblies. The thermal coefficient mismatch can be reduced. The interferometers can be easier to manufacture because of fewer operations during assembly. The reliability and uniformity of the interferometers can be increased.

Unless otherwise defined, all technical and scientific terms used herein have the same meaning as commonly understood by one of ordinary skill in the art to which this invention belongs. All patents, patent applications, and references mentioned herein are incorporated herein by reference; in case of conflict, the definitions in the present document control.

Other features, objects, and advantages of the invention will be apparent from the following detailed description.

DESCRIPTION OF DRAWINGS

FIGS. 4A, 4B, and 4C are schematic, cross-sectional, and perspective views, respectively, of a multi-axis interferometer having two HSPMIs that use thin retarders.

Like reference symbols in the various drawings indicate like elements.

DETAILED DESCRIPTION

Figure 2:
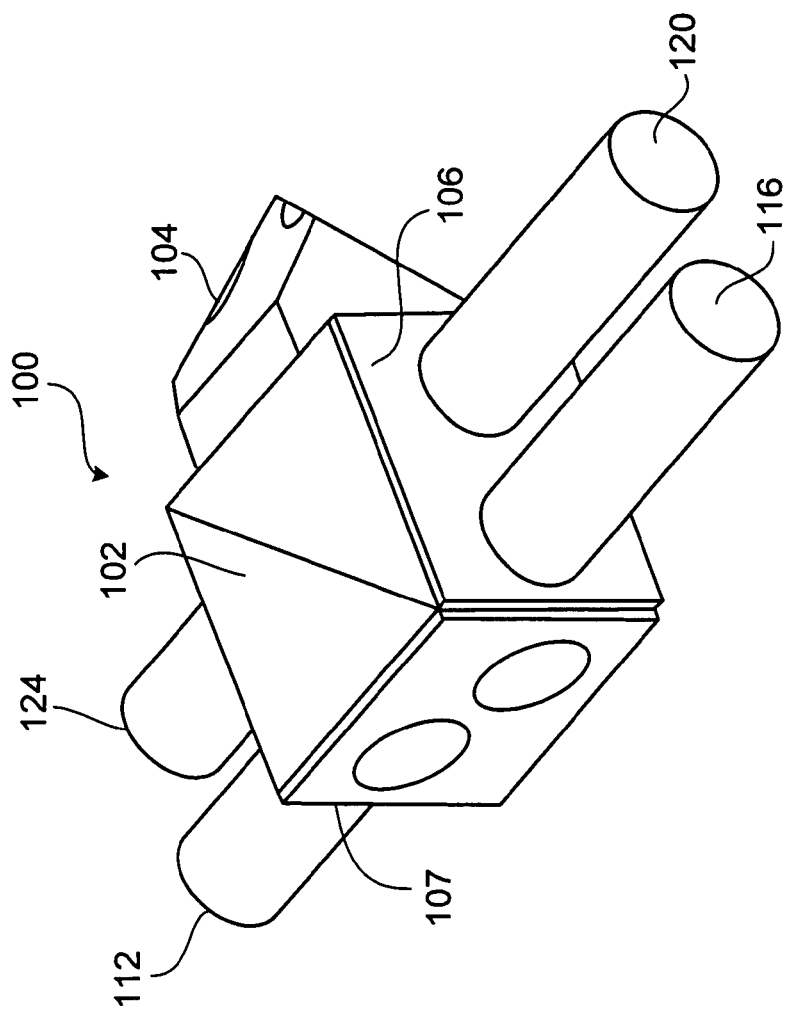
FIGS. 1 and 2 are schematic and perspective views, respectively, of an HSPMI.
Figure 1:
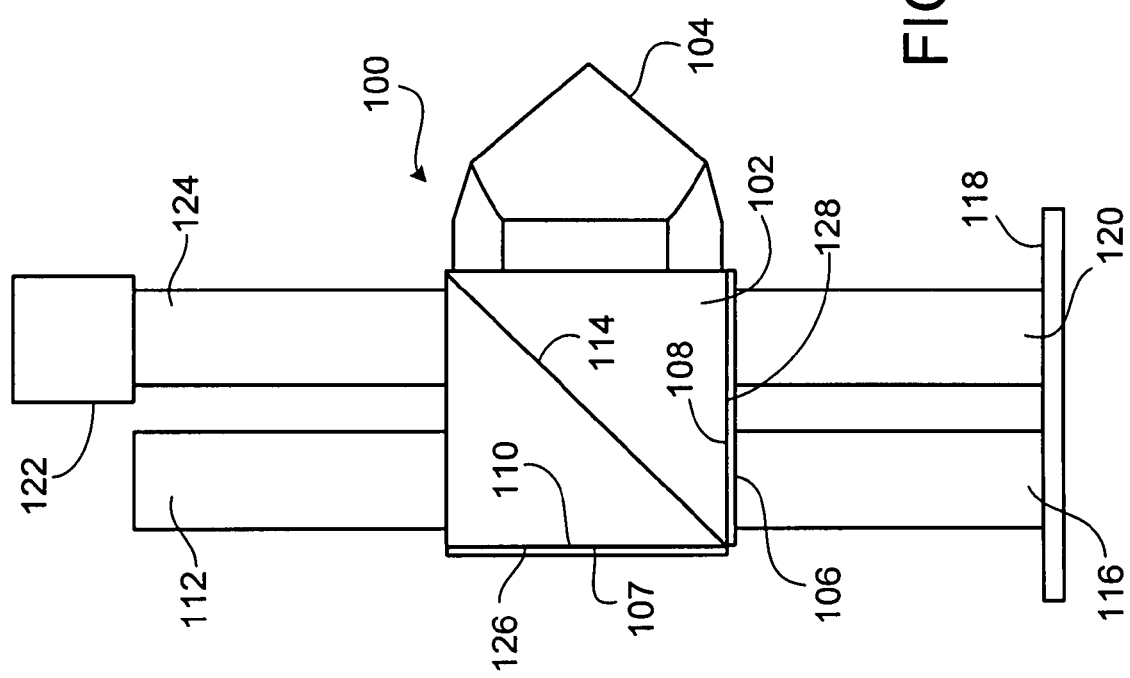

FIGS. 1 and 2 are schematic and perspective views, respectively, of an exemplar HSPMI 100 that has a polarizing beam splitter (PBS) cube 102, a retroreflector 104, and λ/4 retarders 106 and 107 on the measurement leg and the reference leg, respectively. The λ/4 retarders 106 and 107 each has a small physical volume (e.g., having a thickness less than 1 mm). As shown in FIG. 1, the overall physical volume of the interferometer 100 is reduced to the approximate size of the PBS cube 102 and the retroreflector 104.

In this example, the λ/4 retarders 106 and 107 are applied directly to a test face 108 and a reference face 110, respectively, of the PBS cube 102. A highly reflective coating 126 (e.g., a silver coating) is applied onto the λ/4 retarder 107 on the reference face 110 of the PBS cube 102 to form the reference mirror. The highly reflective coating can be replaced by a dielectric mirror. An anti-reflection coating 128 is applied onto the λ/4 retarder 106 on the test face 108 of the PBS cube 102.

During operation of the HSPMI 100, a heterodyne input beam 112 enters the PBS cube 102 and is separated by polarization into a measurement beam and a reference beam. The measurement beam is transmitted by the PBS interface 114 and exits the PBS cube 102 as a primary measurement beam 116 and is reflected back to the PBS cube 102 by a measurement mirror 118 (which can be, e.g., a stage mirror on a wafer or a reticle stage in a microlithography tool). As a result, the primary beam 116 double passes the λ/4 retarder 106 on the measurement face 108 of the PBS cube 102, thereby rotating its linear polarization by 90 degrees and causing the beam 116 to be reflected by the PBS interface 114 to the retroreflector 104, which in turn redirects the beam 116 back to the PBS interface 114, where the beam 116 reflects to form a secondary measurement beam 120.

The secondary beam 120 also reflects from the measurement mirror 118 back to the PBS cube 102, thereby again double passing the λ/4 retarder 106 on the measurement face 108 of the PBS cube 102. As a result, the polarization of the beam 120 is again rotated by 90 degrees so that the beam 120 is transmitted through the PBS interface 114 to a fiber optic pickup (FOP) 122 as one component of an output beam 124.

The other component of the output beam 124 comes from the reference beam, which initially reflects from the PBS interface 114 and then reflects from the mirror coating 126 back to the PBS interface 114, which now transmits the reference beam to the retroreflector 104 because the linear polarization of the reference beam is rotated by 90 degrees following a double pass through the λ/4 retarder 107 on the reference face 110 of the PBS cube 102. The retroreflector 104 redirects the reference beam back to the PBS interface 114 which again transmits the reference beam to the mirror coating 126, which reflects the reference beam back to the PBS interface 114, following another double pass through the λ/4 retarder 107 on the reference face 110 of the PBS cube 102, causing the reference beam to now reflect from the PBS interface 114 and form the reference component of the output beam 124 at the FOP 122.

There are numerous technologies that could be used to form the thin, optically flat, retarders (e.g., 106 and 107) described above. First, the retarders can be based on sub-wavelength gratings and patterns formed by hot imprint lithography. Such devices are pressed directly into the surface of a glass substrate and then filled with a dielectric material ("trench filled") with a different index of refraction than the glass substrate. The result is a birefringent structure that can be customized and oriented precisely for the given application. The complete structure can be subsequently treated with optical coatings like anti-reflection or high-reflection coatings. Such thin coating can be obtained from, for example, NanoOpto Corp., Somerset, N.J. See the web site "http://www.nanoopto.com/news/pr_1_31_05_b.html". A thin retarder made using hot imprint lithography can have a thickness of a few hundred nanometers (e.g., about 300 nm).

Another technology that can be used to form the thin retarders (e.g., 106 and 107) is the use of photo-aligned liquid crystal materials. The photo-alignment is achieved using linearly photopolymerizable polymer (LPP) materials, which align in a specific direction when illuminated with polarized UV-light. Polarization retarders can be custom tailored using this technology. Such λ/4 retarders can be applied directly to the surfaces of the PBS cube, and are sufficiently flat to be subsequently treated with optical coatings like Anti-reflection and Hi-Reflection coatings. Thin retarders using LPP materials are available from, for example, JDSU, Santa Rosa, Calif., which licenses its technology from Rolic Technologies, Allschwil, Switzerland. See the web site "http://www.rolic.com/312/index.html". A thin retarder made using LPP materials can have a thickness of about a few hundred microns or less (e.g., about 125 microns or less).

Thin retarders having a thickness of about 2 microns have been obtained from JDSU and applied directly to the glass substrate of the PBS 102 and then coated with the anit-reflection coating (for the test face 108) or the high-reflection coating (for the reference face 110).

While each of these technologies can be used to form the retarder directly on a surface of the PBS cube 102, a surface of the retroreflector 104, or some other interferometer surface (e.g., the entrance face of a solid, corner-cube, retroreflector), in other examples, the λ/4 retarders can be applied to a thin wafer of optical glass, e.g., made from the same material as the PBS cube 102 to optimize thermal compatibility. The thin wafer can be applied to the thin wafer of optical glass with optical adhesive, index matching optical adhesive, optical contact where Van Der Wahls forces interact at the interface, or silicate bonding. The wafer of optical glass can be a fraction of a millimeter thick, substantially reducing the physical volume of the λ/4 retarder.

Another technology that can be used to form the thin λ/4 retarder (e.g., 106 and 107)) is to use a very thin piece of quartz or some other similar birefringent, inorganic material (this is sometimes referred to as a "true-zero order" waveplate.") The thin piece of quartz and other birefringent materials are polished to have thicknesses that yield the first quarter wave of retardance between S and P polarization states. For example, the thickness of a true-zero order λ/4 waveplate for 632.8 nm light is 17.47 μm. This type of retarder can also be a low order waveplate where the thickness is a small multiple of the true-zero order device. The multiple can be an odd integer for a λ/4 retarder and every third multiple for a λ/2 retarder.

This type of waveplate can be directly bonded (using any of the techniques described above) to the PBS cube 102 as a substrate and then polished to the correct thickness, then coated with the appropriate thin film anti-reflection or high-reflection coating. Such thin retarders can be obtained from, for example, Photop, Fujian, China. See the web site "http://www.photoptech.com/optics/product/catalog/instrumental/True%20Zero%20Order%20Waveplate.pdf".

Although the examples described above mainly focus on quarter-wave retarders, with application to the PBS surfaces of an HSPMI, the thin retarders can have other applications. The thin retarders may be fabricated to have other values of retardation, and may be applied to other interferometer surfaces. In general, a thin retarder can be formed wherever retardation and compact size is desired. For example, in many multi-axis interferometer designs, a half-wave retarder is used to rotate the polarization of an intermediate beam by 90 degrees.

The HSPMI 100 (FIG. 1) is useful in applications where multiple such interferometers are combined to provide multiple measurement axes with a small beam footprint. Below is a comparison of a conventional design of multi-axis interferometers using thicker retarders and another design using thin retarders.

Figure 3C:
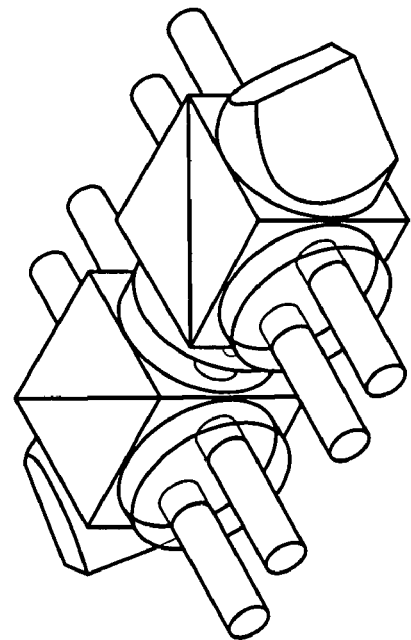
FIGS. 3A, 3B, and 3C are schematic, cross-sectional, and perspective views, respectively, of a conventional multi-axis interferometer.
Figure 3A:
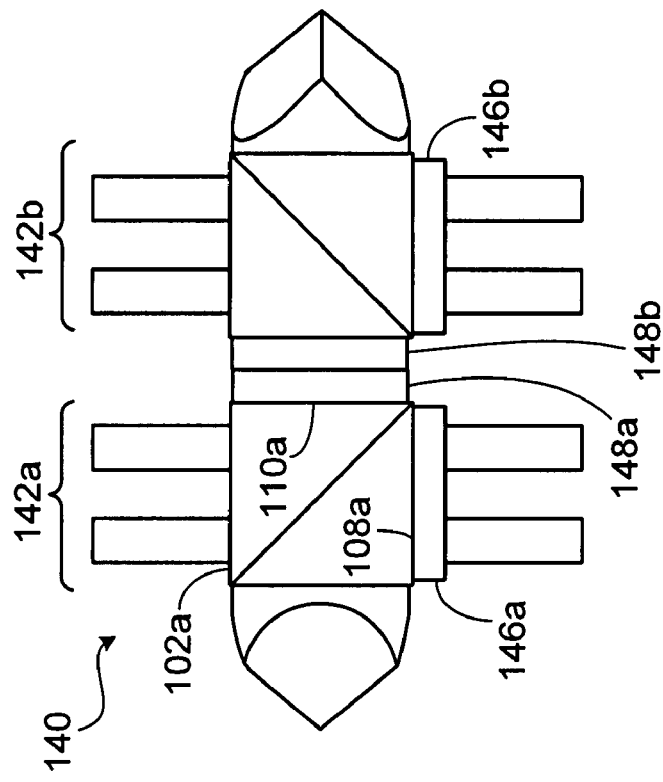
Figure 3B:
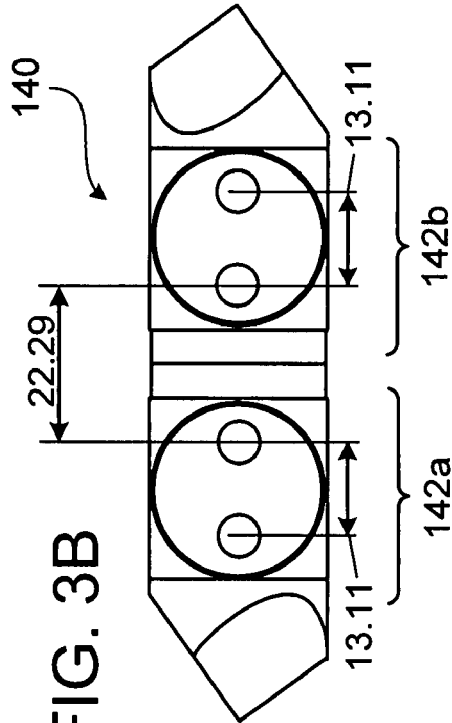

FIGS. 3A, 3B, and 3C are schematic, cross-sectional, and perspective views, respectively, of a conventional multi-axis interferometer 140 having two HSPMIs 142a and 142b, each HSPMI using λ/4 retarders (e.g., 146a, 148a, 146b, and 148b) with significant physical volume. The λ/4 retarders 146a, 148a, 146b, and 148b each has a thickness of about 5 mm. The thickness of the λ/4 retarders 148a and 148b applied to the reference faces have thicknesses that match those of the λ/4 retarders 146a and 146b applied to the test faces so that the path lengths in glass between the test and reference legs are the same.

As shown in FIG. 3B, for an HSPMI with a 13.11 mm primary-to-secondary beam spacing and a reference mirror thickness of 5 mm, the minimum primary-to-primary spacing of the interferometer 140 is about 22.29 mm.

FIGS. 4A, 4B, and 4C are schematic, cross-sectional, and perspective views, respectively, of a multi-axis interferometer 150 having two HSPMIs 152a and 152b, each HSPMI using thin λ/4 retarders (e.g., 154a, 156a, 154b, and 156b) described above. The thickness of the λ/4 retarders 156a and 156b applied to the reference faces have thicknesses that match those of the λ/4 retarders 154a and 154b applied to the test faces so that the path lengths in glass between the test and reference legs are the same. The thin retarders each has a thickness less than 1 mm, so the overall physical volume of the interferometer 150 is smaller, as compared to the interferometer 140 (FIG. 3A).

As shown in FIG. 4B, for an HSPMI with a 13.11 mm primary-to-secondary beam spacing and a reference mirror thickness of less than 1 mm, a small primary-to-primary spacing of 13.11 mm can be achieved.

In some examples, the shape and clear apertures do not need to be circular as shown in FIGS. 3B and 4B. Any format that allows the beam footprint to be enclosed by the λ/4 retarders can be used.

In the HSPMI 100 (FIG. 1), the reference mirror 126 is a coating applied to the λ/4 retarder 107 on the reference face of the PBS 102. In some examples, a reference mirror that is spaced apart from the retarder 107 and PBS 102 can be used.

Figure 5:
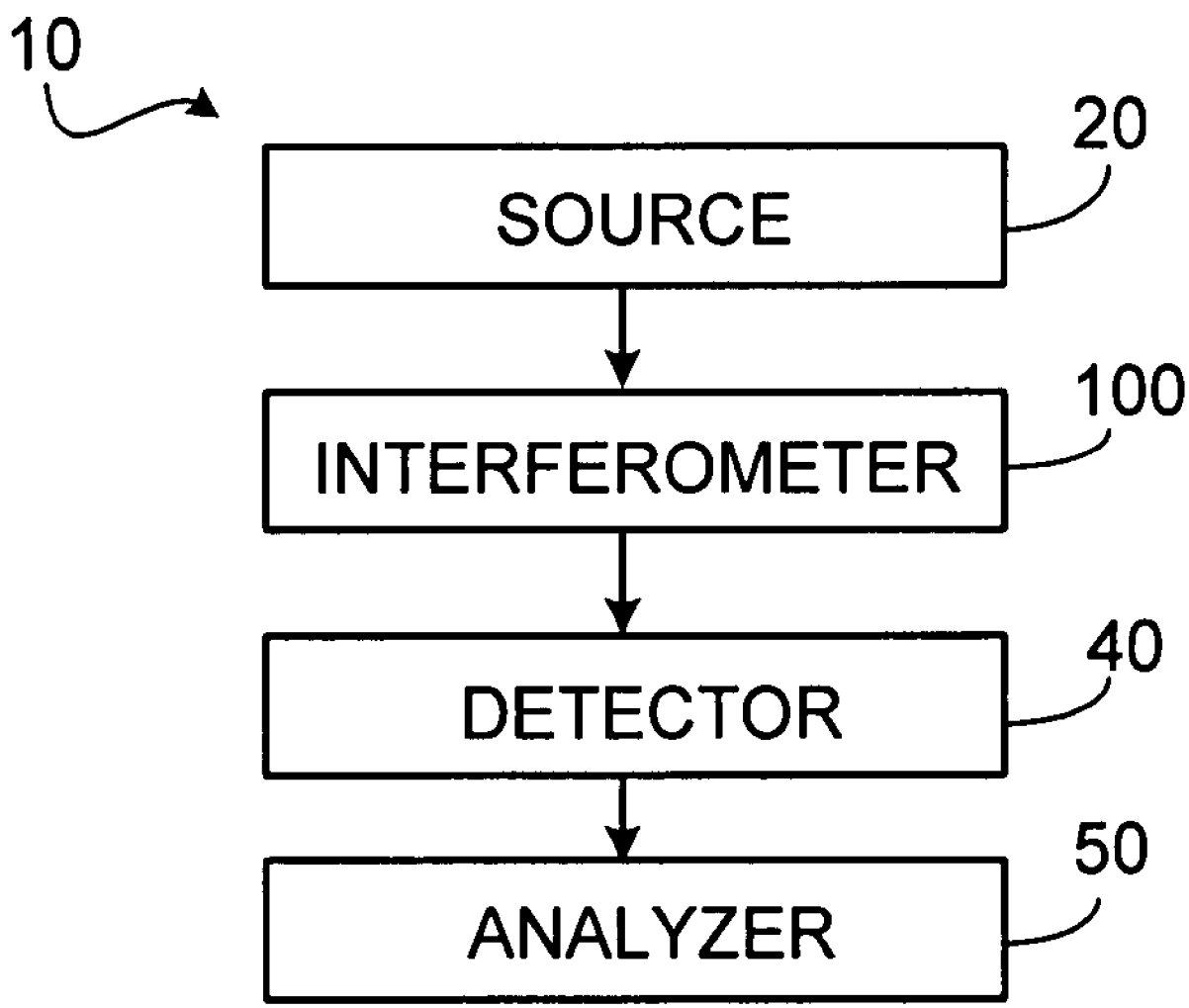
FIG. 5 is a schematic diagram of a lithography system.

The HSPMI 100 can be used in, e.g., interferometry systems. Referring to FIG. 5, an interferometry system 10 includes a source 20, an interferometer 100 (which can also be the HSPMI 130), a detector 40, and an analyzer 50. Source 20 includes a laser for providing the input beam 112 to interferometer 100. In one example where heterodyne interferometry technique is used, input beam 112 includes two different frequency components having orthogonal polarizations. The orthogonally polarized components pass through the interferometer 100, where they are separated into measurement and reference beams using the polarizing beam splitter 102, as described above. The reference beam travels along a reference path. The measurement beam travels along a measurement path. The reference and measurement beams are later combined by the PBS 102 to form the exit beam 124 with overlapping exit measurement and reference beams. In a homodyne interferometry system, a non-polarizing beam splitter may be used to separate the input beam into the measurement and reference beams.

Exit beam 124 subsequently passes through a polarizer (not shown). The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams. The interference contains information about the relative difference in optical path length between the reference and measurement paths. For HSPMI 100, the reference path is fixed and the changes in the optical path length difference correspond to changes in the optical path length of the measurement path.

Detector 40 includes a photodetector that measures the time-dependent intensity of the mixed beam and generates an electrical interference signal proportional to that intensity. Detector 40 may also include electronic components (e.g., an amplifier and an analog-to-digital converter) that amplifies the output from the photodetector and produces a digital signal corresponding to the optical interference.

The interferometry system 10 above provide accurate measurements and are especially useful in lithography applications used in fabricating large scale integrated circuits, for example, computer chips. Lithography is a key technology driver for the semiconductor manufacturing industry. Overlay improvement is one of the five most difficult challenges down to and below 100 nm line widths (design rules), as mentioned in the *Semiconductor Industry Roadmap*, p 82 (1997).

Overlay depends directly on the performance, i.e., accuracy and precision, of the distance measuring interferometers used to position a wafer and reticle (or mask) stages. Since a lithography tool may produce $50-100 M/year of products, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

To properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photochemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary structure and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 6:
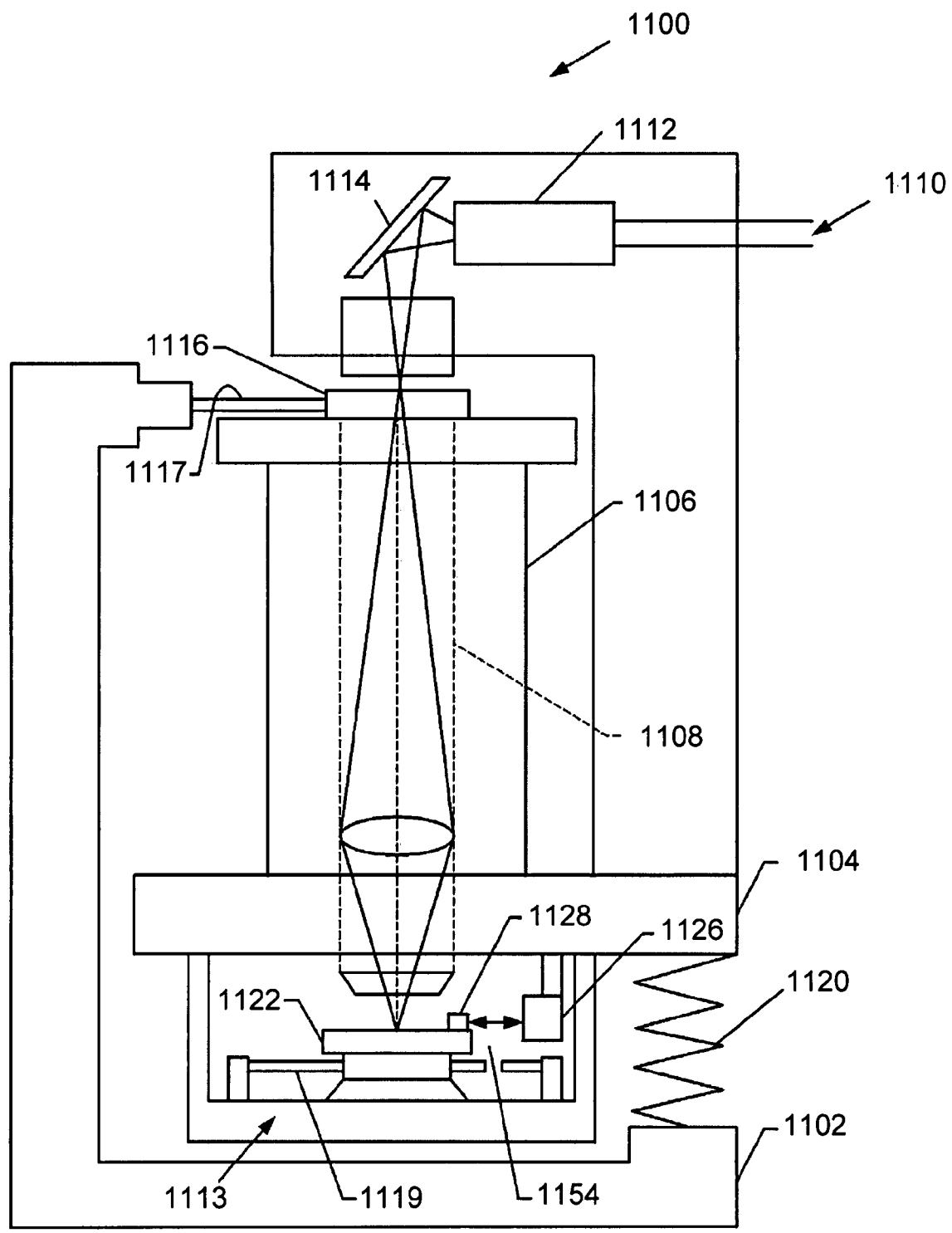
FIGS. 6 and 7 are flow diagrams that describes steps for making integrated circuits.

An example of a lithography scanner 1100 using an interferometry system 1126 is shown in FIG. 6. Interferometry system 1126 is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics.

In another example of a lithography scanner, one or more interferometry systems described above can also be used to precisely measure the position of mask stage 1116 as well as other moveable elements whose position must be accurately monitored in processes for fabricating lithographic structures.

Suspended below exposure base 1104 is a support base 1113 that carries wafer stage 1122. Stage 1122 includes a plane mirror 1128 for reflecting a measurement beam 1154 directed to stage 1122 by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to interferometry system 1126, which is mounted on exposure base 1104. Interferometry system 1126 may include any of the examples of interferometry systems described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other examples of the lithographic scanner, one or more of the interferometry systems described previously can be used to measure distances along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some examples, lithographic scanner 1100 can include what is known as a column reference. In such examples, interferometry system 1126 directs the reference beam (not shown) along an external reference path that contacts a reference mirror (not shown) mounted on some structure that directs the radiation beam, e.g., lens housing 1106. The reference mirror reflects the reference beam back to interferometry system 1126. An interference signal is produced by interferometry system 1126 by combining measurement beam 1154 reflected from stage 1122 and the reference beam reflected from a reference mirror mounted on the lens housing 1106. The interference signal indicates changes in the position of stage 1122 relative to the radiation beam. Furthermore, in other examples, interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 7:
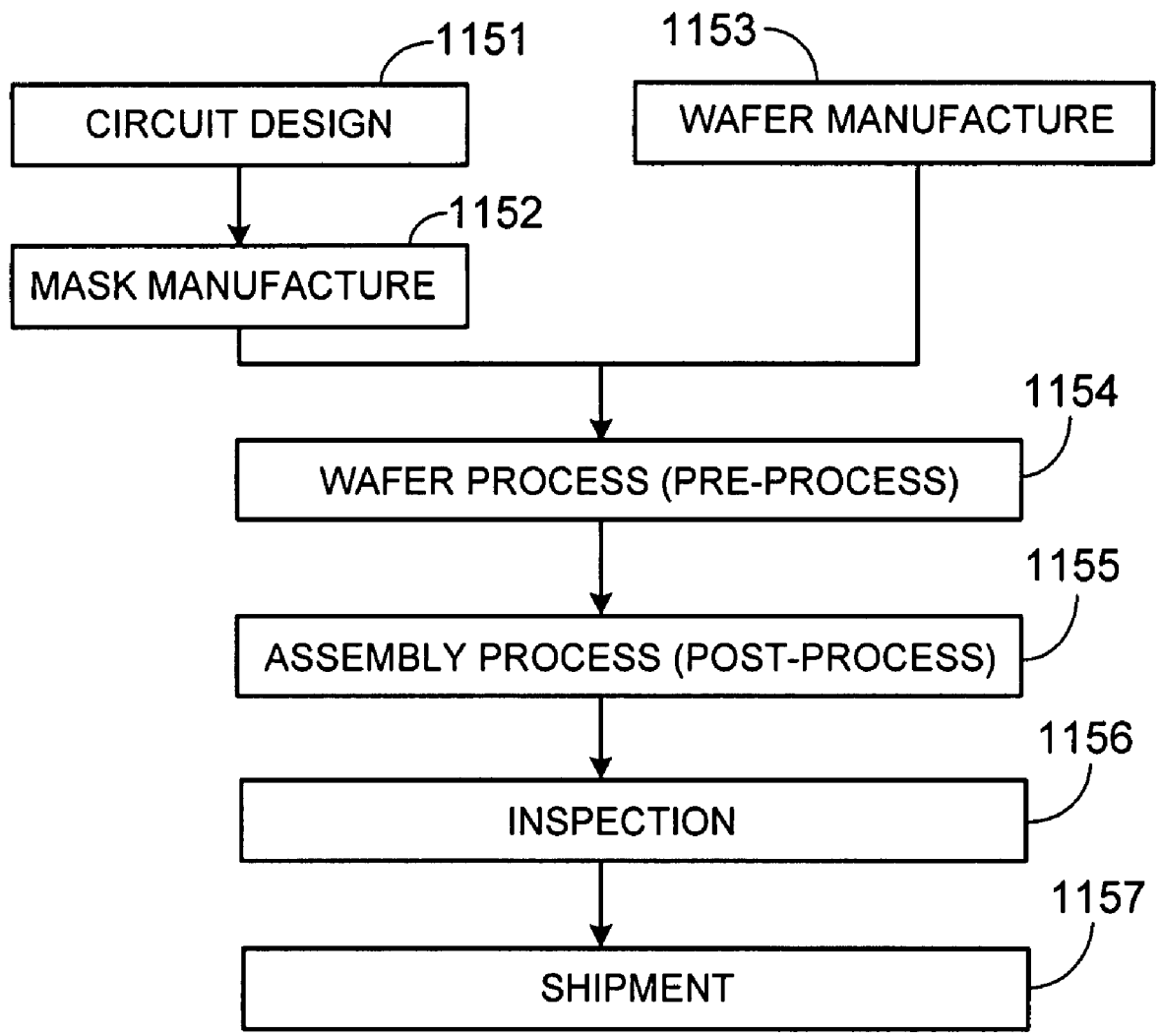

Lithography is a critical part of manufacturing methods for making semiconductor devices. For example, U.S. Pat. No. 5,483,343 outlines steps for such manufacturing methods. These steps are described below with reference to FIGS. 7 and 8. FIG. 7 is a flow chart of the sequence of manufacturing a semiconductor device such as a semiconductor chip (e.g., IC or LSI), a liquid crystal panel, or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the prepared mask and wafer, circuits are formed on the wafer through lithography. To form circuits on the wafer that correspond with sufficient spatial resolution those patterns on the mask, interferometric positioning of the lithography tool relative to the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check and so on of the semiconductor devices produced by step 1155 are carried out. With these processes, semiconductor devices are finished and they are shipped (step 1157).

Figure 8:
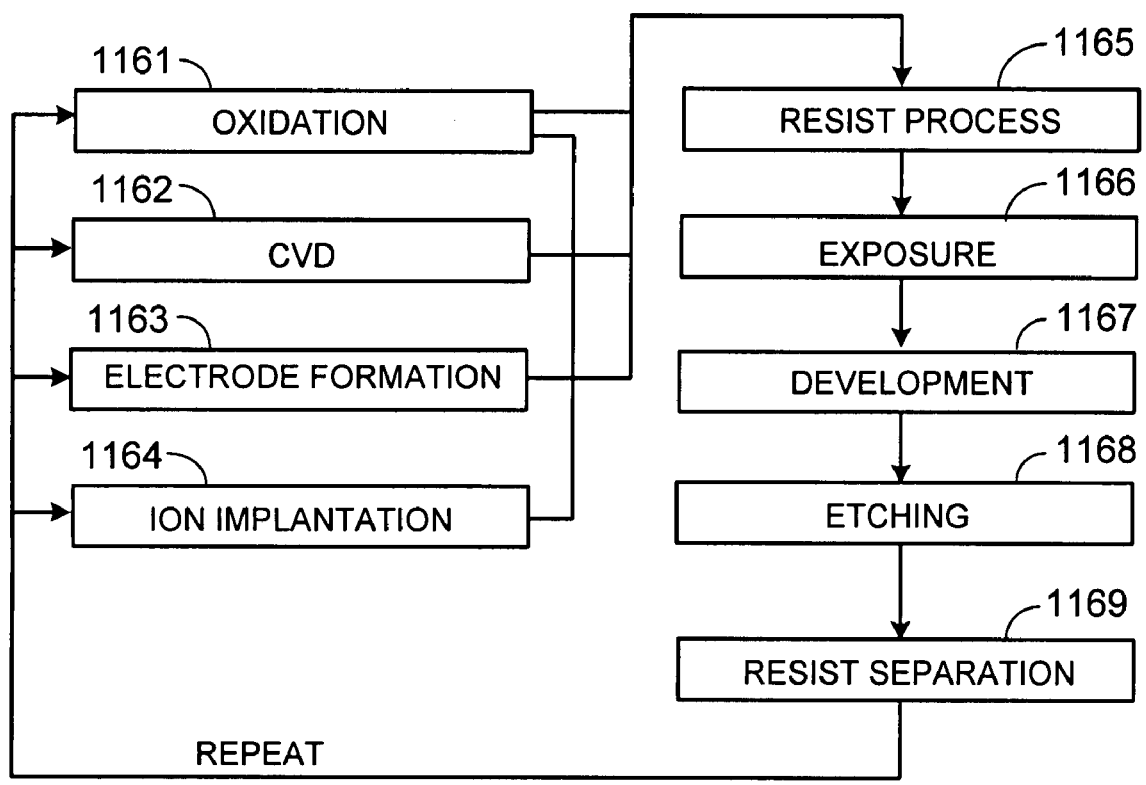
FIG. 8 is a schematic diagram of a beam writing system.

FIG. 8 is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 9:
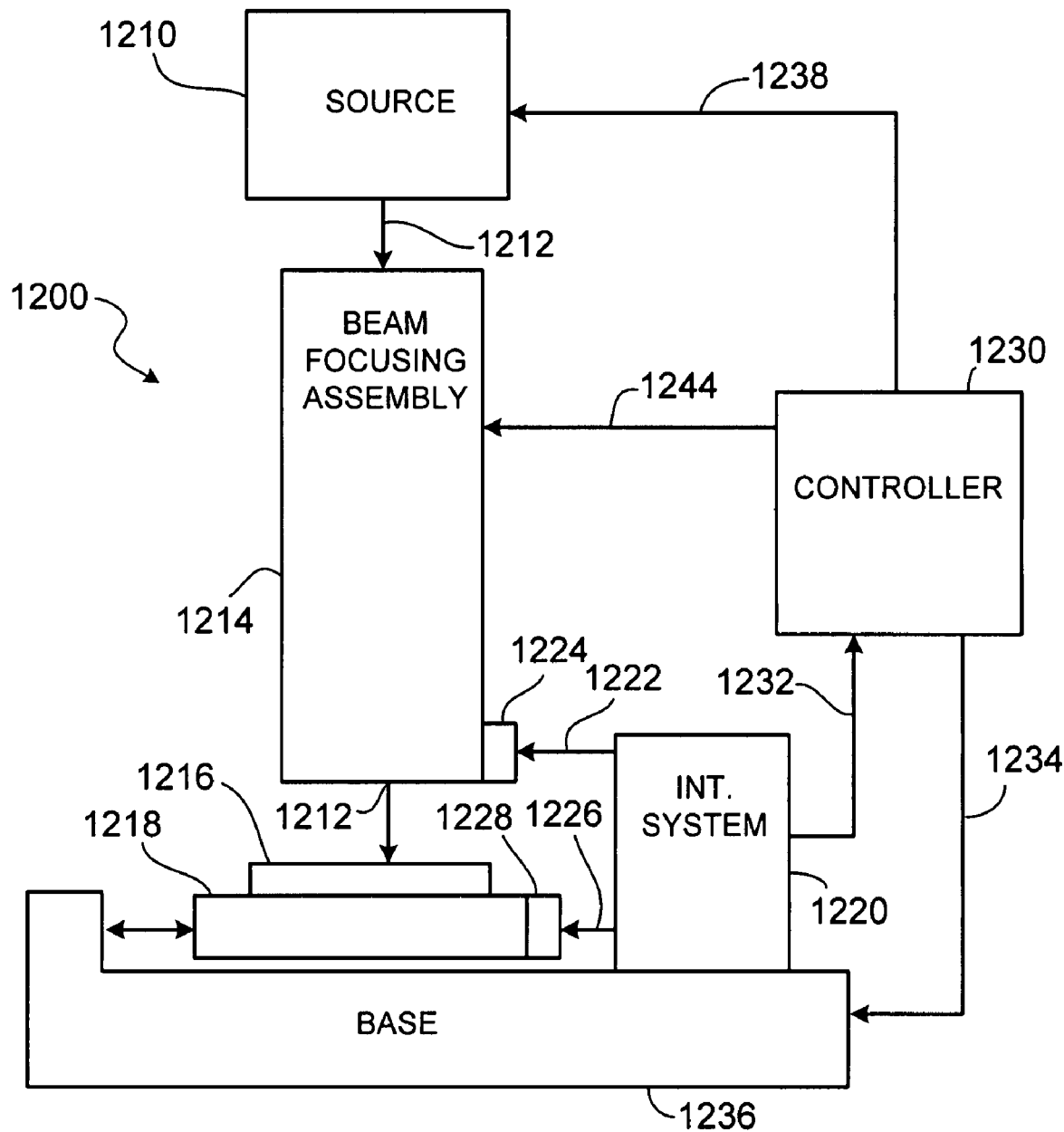
FIG. 9 is a schematic diagram of an interferometry system.

Referring to FIG. 9, an example of a beam writing system 1200 includes an interferometry system 1220 that uses a column reference. A source 1210 generates a write beam 1212. A beam focusing assembly 1214 directs the radiation beam to a substrate 1216 supported by a movable stage 1218. To determine the relative position of stage 1218, the interferometry system 1220 directs a reference beam 1222 to a mirror 1224 mounted on beam focusing assembly 1214 and a measurement beam 1226 to a mirror 1228 mounted on stage 1218.

Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts substrate 1216 with an intensity sufficient to cause photophysical or photochemical change only at selected positions of the substrate.

Furthermore, in some examples, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

A number of embodiments of the invention have been described. Nevertheless, it will be understood that various modifications may be made without departing from the spirit and scope of the invention. For example, the HSPMI 100 in FIG. 1 has a "straight through" configuration, in which the measurement beam passes straight through the PBS 102 to the measurement object 118. By switching the location of the high reflection coating 126 and the anti-reflection coating 128, the interferometer 100 can operate in a "right angle" configuration, in which the measurement beam contacts the measurement object along a path that is orthogonal to the input beam path. The dimensions of the PBS 102 and the retarders (e.g., 106, 107, 146a, 146b, 148a, 148b, 154a, 154b, 156a, 156b) can be different from those described above.

The thin retarders can be used with interferometers different from those described above. For example, the interferometer can be a ZPMI, a multi-axis interferometer where more than one secondary beam is generated from a single primary beam. The interferometer can be a large aperture surface interferometer. The thin retarders can be applied to optical devices other than those described above.

What is claimed is:

1. Apparatus comprising:
    an interferometer comprising
        at least one thin retarder on a surface of the interferometer, the thin retarder being less than 1 mm, is optically flat, and is secured to the surface of the interferometer without a glass cover plate, the thin retarder comprising a quarter-wave retarder or a half-wave retarder;
        first optical components to direct a measurement light beam or a reference light beam through the thin retarder; and
        second optical components to combine the measurement and reference light beams to generate an interference signal for use in measuring a position or a movement of a measurement object.

2. The apparatus of claim 1, wherein the retarder is thinner than 500 microns.

3. The apparatus of claim 1, wherein the thin retarder has a coating applied directly onto it.

4. The apparatus of claim 3, wherein the coating is an anti-reflection coating or a high-reflection coating.

5. The apparatus of claim 1, wherein the interferometer is a double-pass interferometer.

6. The apparatus of claim 1, wherein the interferometer is a high-stability plane mirror interferometer.

7. The apparatus of claim 1, wherein the interferometer comprises a polarizing beam splitter.

8. The apparatus of claim 7, wherein the thin retarder is applied to a surface of the polarizing beam splitter.

9. The apparatus of claim 8, wherein the thin retarder is applied to a reference face of the polarizing beam splitter and the interferometer comprises a second thin retarder applied to a measurement face of the polarizing beam splitter.

10. The apparatus of claim 1, wherein the interferometer further comprises a retroreflector and wherein the thin retarder is applied to a surface of the retroreflector.

11. The apparatus of claim 1, further comprising a second interferometer next to the first mentioned interferometer, the second interferometer having a second thin retarder on a surface of the second interferometer, the second thin retarder being less than 1 mm and is secured to the surface of the second interferometer without a glass cover plate, wherein the first and second interferometers are oriented such that the first mentioned thin retarder faces the second thin retarder.

12. The apparatus of claim 1, wherein the thin retarder comprises a sub-wavelength grating or pattern formed in the surface.

13. The apparatus of claim 1, wherein the thin retarder comprises linearly photopolymerizable polymer (LPP) material.

14. The apparatus of claim 1, wherein the thin retarder comprises an inorganic, birefringent material having a thickness less than 200 microns.

15. The apparatus of claim 14, wherein the birefringent material has a thickness less than 50 microns.

16. The apparatus of claim 14, wherein the birefringent material is quartz.

17. The apparatus of claim 1 wherein the interferometer comprises a polarizing beam splitter, and the at least one thin retarder comprises a linearly photopolymerizable polymer (LPP) material coated onto a surface of the polarizing beam splitter to form a film.

18. The apparatus of claim 17, wherein the film has a thickness less than 10 micrometers.

19. The apparatus of claim 1, wherein the interferometer comprises a retroreflector having a surface for receiving an input light beam that is retro-reflected to form an output light beam that passes the surface, and the at least one thin retarder comprises a linearly photopolymerizable polymer (LPP) material coated onto at least a portion of the surface of the retroreflector.

20. The apparatus of claim 1 further comprising:
a source to provide a write beam to pattern a substrate,
a stage to support the substrate,
a beam directing assembly to deliver the write beam to the substrate, and
a positioning system to position the stage and beam directing assembly relative to one another, in which the interferometer and the optics are used to measure the position of the stage relative to the beam directing assembly.

21. A method comprising:
coating a linearly photopolymerizable polymer (LPP) material onto an optical surface of an interferometer to form a film;
processing the LPP material to have a specific thickness to form a thin retarder that is a quarter wave plate or a half wave plate, the thin retarder being optically flat and having a thickness less than 1 mm;
wherein the interferometer has first optical components to direct a measurement light beam or a reference light beam through the thin retarder, and second optical components to combine the measurement and reference light beams to generate an interference signal for use in measuring a position or a movement of a measurement object.

22. The method of claim 21 in which the retarder is thinner than 500 microns.

23. A method comprising
applying at least one thin retarder on a surface of an interferometer, the thin retarder being less than 1 mm and having a specific thickness to form a quarter wave plate or a half wave plate, is optically flat, and is secured to the surface of the interferometer without a glass cover plate,
wherein the interferometer has first optical components to direct a measurement light beam or a reference light beam through the thin retarder, and second optical components to combine the measurement and reference light beams to generate an interference signal for use in measuring a position or a movement of a measurement object.

24. The method of claim 23, wherein the retarder is thinner than 500 microns.

25. A method comprising:
for a given lithography tool having a stage to position and support wafers, the stage having a mirror for reflecting a measurement beam directed to the stage by an interferometer, modifying the lithography tool by reducing a size of the interferometer to increase a distance that can be traveled by the stage and enable the lithography tool to process larger wafers than prior to modification, the size of the interferometer being reduced by using at least a thin retarder on a surface of the interferometer, the thin retarder having a thickness less than 1 millimeter.

26. The method of claim 25 wherein the thin retarder comprises a quarter-wave retarder.

27. The method of claim 25 wherein the thin retarder comprises a half-wave retarder.

28. The method of claim 25 wherein the thin retarder has a thickness less than 500 microns.

29. A lithography system for use in fabricating integrated circuits on a wafer, comprising:
a stage to support the wafer;
an illumination system to image spatially patterned radiation onto the wafer;
a positioning system to adjust the position of the stage relative to the imaged radiation; and
the apparatus of claim 1 to measure the position of the stage along a first degree of freedom.

30. The lithography system of claim 29 further comprising a second one of the apparatus of claim 1 to measure the position of the stage along a second degree of freedom.

31. A lithography system for use in fabricating integrated circuits on a wafer, comprising:
a stage to support the wafer;
an illumination system including a radiation source, a mask, a positioning system, a lens assembly, and the apparatus of claim 1 in which during operation the source directs radiation through the mask to produce spatially patterned radiation, the positioning system adjusts the position of the mask relative to wafer, the lens assembly images the spatially patterned radiation onto the wafer, and the apparatus of claim 1 measures the position of the mask along a first degree of freedom relative to the wafer.

32. The lithography system of claim 31 further comprising a second one of the apparatus of claim 1 to measure the position of the mask along a second degree of freedom.

* * * * *